(12) United States Patent
Ishizawa et al.

(10) Patent No.: US 6,709,914 B2
(45) Date of Patent: Mar. 23, 2004

(54) MANUFACTURING PROCESS OF PN JUNCTION DIODE DEVICE AND PN JUNCTION DIODE DEVICE

(75) Inventors: Shinichi Ishizawa, Fukuoka (JP); Yoshifumi Tomomatsu, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/331,646

(22) Filed: Dec. 31, 2002

(65) Prior Publication Data

US 2003/0141513 A1 Jul. 31, 2003

(30) Foreign Application Priority Data

Jan. 31, 2002 (JP) ........................ 2002-023676

(51) Int. Cl.$^7$ ............... H01L 21/8234; H01L 29/88
(52) U.S. Cl. ............... 438/237; 438/912; 257/104
(58) Field of Search ................ 438/208, 220, 438/237, 256, 414, 741, 912, 380; 257/104, 798

(56) References Cited

FOREIGN PATENT DOCUMENTS

| EP | 0 878 849 A2 | 11/1998 |
|---|---|---|
| JP | 4-214674 | 8/1992 |
| JP | 10-116998 | 5/1998 |

OTHER PUBLICATIONS

Derwent Abstract Publication No. JP 07235663A Matsushita Electric Works Ltd. Feb. 1994.*

* cited by examiner

Primary Examiner—Craig A. Thompson
(74) Attorney, Agent, or Firm—Oblon, Spivak, McClelland, Maier & Neustadt, P.C.

(57) ABSTRACT

One aspect of the present invention is a to provide a process for manufacturing a pn junction diode, includes providing a semiconductor wafer having an n-type cathode layer formed thereon. Then, a p-type anode layer is formed on the n-type cathode layer so that a pn junction interface is formed between the n-type cathode layer and the p-type anode layer. Next, a cathode and anode electrodes are formed on the semiconductor wafer and the p-type anode layer, respectively. Lastly, first and second ions having average projection ranges Rp different from each other are simultaneously implanted up to the cathode layer so that one or more first and second implanted regions are formed alternately and overlapped side by side, thereby forming a lattice-defect region having a substantially uniform thickness beneath and adjacent to the pn junction interface.

19 Claims, 10 Drawing Sheets

MANUFACTURING PROCESS OF PN JUNCTION DIODE DEVICE AND PN JUNCTION DIODE DEVICE

BACKGROUND OF THE INVENTION

1) Technical field of the Invention

The present invention relates to an pn junction diode device and a manufacturing process thereof, and in particular to the pn junction diode device having less deviation of forward voltages between the devices and the manufacturing process thereof.

2) Description of Related Arts

FIG. 9 is a cross sectional view of a conventional pn junction diode device denoted by a reference numeral 200, which can be used as a switching device as well as a transistor. As illustrated in FIG. 9, the pn junction diode device 200 has a stacked structure including, in general, an n+ cathode layer 1, an n– cathode layer 2, and a p– anode layer 3. A pn junction interface 4 is formed at the interface between the n– cathode layer 2 and the p– anode layer 3. Each of the aforementioned layers is made of material including silicon.

Deposited on the top surface of the p– anode layer 3 is an anode electrode 5, while formed on the bottom surface of the n+ cathode layer 1 is a cathode electrode 6. Each of the electrodes is made of material such as aluminum.

The pn junction diode device 200 has a lattice-defect region 17 in the n– cathode layer 2 formed beneath and adjacent to the pn junction interface 4. In the lattice-defect region, a plurality of defective lattices are distributed in accordance with a normal distribution having a half-value width T. The lattice-defect region 17 is formed by implanting ions such as proton and helium ion after formation of the layers 1 to 6, and by annealing thereof. In general, this ion implanting step is conducted through a absorber 8 made of aluminum. During the annealing step, most of the implanted ions are evacuated from the n– cathode layer 2, leaving the lattice-defect region 17. The half-value width T may be distributed, for example, about 10 microns in the depth direction.

FIG. 10 is a graph illustrating carrier concentrations and a lattice-defect concentration depending upon the vertical distance (depth) from the top surface of the pn junction diode device 200. Thus, the anode and cathode electrodes 5, 6 are located to the left and right sides in FIG. 10, respectively. Also, the denotations of "p", "n", and "q" in FIG. 10 indicate the distributions of the p-type and n-type impurity concentrations and the lattice-defect concentration, respectively. The Roman numerals I, II, and III denote regions for the p– anode layer 3, the n– cathode layer 2, and the n+cathode layer 1, respectively.

In FIG. 10, the lattice-defect region 17 is formed adjacent to the pn junction interface and within the n– cathode layer (II), and has the half-value width T.

The lattice-defect region 17 serves a function as so-called a "life-time killer", thus, it captures and quenches the minority carriers, i.e., holes injected from the p– anode layer 3 into the n– cathode layer 2. To this end, the pn junction diode device 200 can be protected from a reverse surge potential and a high rate switching can be realized.

Each of the conventional pn junction diode devices 200 is manufactured by forming a plurality of devices formed on the semiconductor wafer having a diameter of 5 inches and then by dicing the wafer to each individual pn junction diode device. Disadvantageously, there exists a substantial deviation of forward voltages ($V_F$) between the pn junction diode devices 200 formed even on the same wafer.

The present inventors have dedicated to study the deviation of the forward voltages and found that this is caused by the deviation of the lattice-defect concentration in the lattice-defect region 17. Also, the present inventors have revealed that the deviation of the lattice-defect concentration can be reduced by expanding the half-value width and reducing the peak concentration, maintaining the total number of the defective lattices unchanged in the lattice-defect region 17.

However, in order to expand the half-value width of the lattice-defect region 17, in general, it is necessary to repeat the ion implantation steps with implantation energies different from each other for achieving individual projection ranges. Such a multiple of ion implantation steps cause the manufacturing process to be lengthy and complicated, thereby raising the manufacturing cost.

Therefore, one of the aspects of the present invention has an object to provide the manufacturing process of the pn junction diode device with the lattice-defect region having the wider half-value width without increasing any implantation steps, and to provide the pn junction diode device so manufactured.

SUMMARY OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

The first aspect of the present invention is to provide a process for manufacturing a pn junction diode, includes providing a semiconductor wafer having an n-type cathode layer formed thereon. Then, a p-type anode layer is formed on the n-type cathode layer so that a pn junction interface is formed between the n-type cathode layer and the p-type anode layer. Next, a cathode and anode electrodes are formed on the semiconductor wafer and the p-type anode layer, respectively. Lastly, first and second ions having average projection ranges Rp different from each other are simultaneously implanted up to the cathode layer so that one or more first and second implanted regions are formed alternately and overlapped side by side, thereby forming a lattice-defect region having a substantially uniform thickness.

The second aspect of the present invention is a to provide a pn junction diode includes a semiconductor wafer having an n-type cathode layer. Also, a p-type anode layer is formed on the n-type cathode layer so that a pn junction interface is formed between the n-type cathode layer and the p-type anode layer. A cathode and anode electrodes are formed on the semiconductor wafer and the p-type anode layer, respectively. Lastly, a lattice-defect region in the n-type cathode layer having a substantially uniform thickness is formed beneath and adjacent to the pn junction interface. The lattice-defect region has a distribution of lattice-defect concentration with a half-value width greater than that of the lattice-defect region formed by implanting ions having an average projection ranges Rp substantially the same as each other.

BRIEF DESCRIPTION OF THE DRAWINGS

The present invention will more fully be understood from the detailed description given hereinafter and accompanying drawings which are given by way of illustration only, and thus are not limitative of the present invention and wherein.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "upper", "lower", and "vertical") are conveniently used just for clarity, it should not be interpreted that those terminology limit the scope of the present invention.

Embodiment 1.

Figure 1:
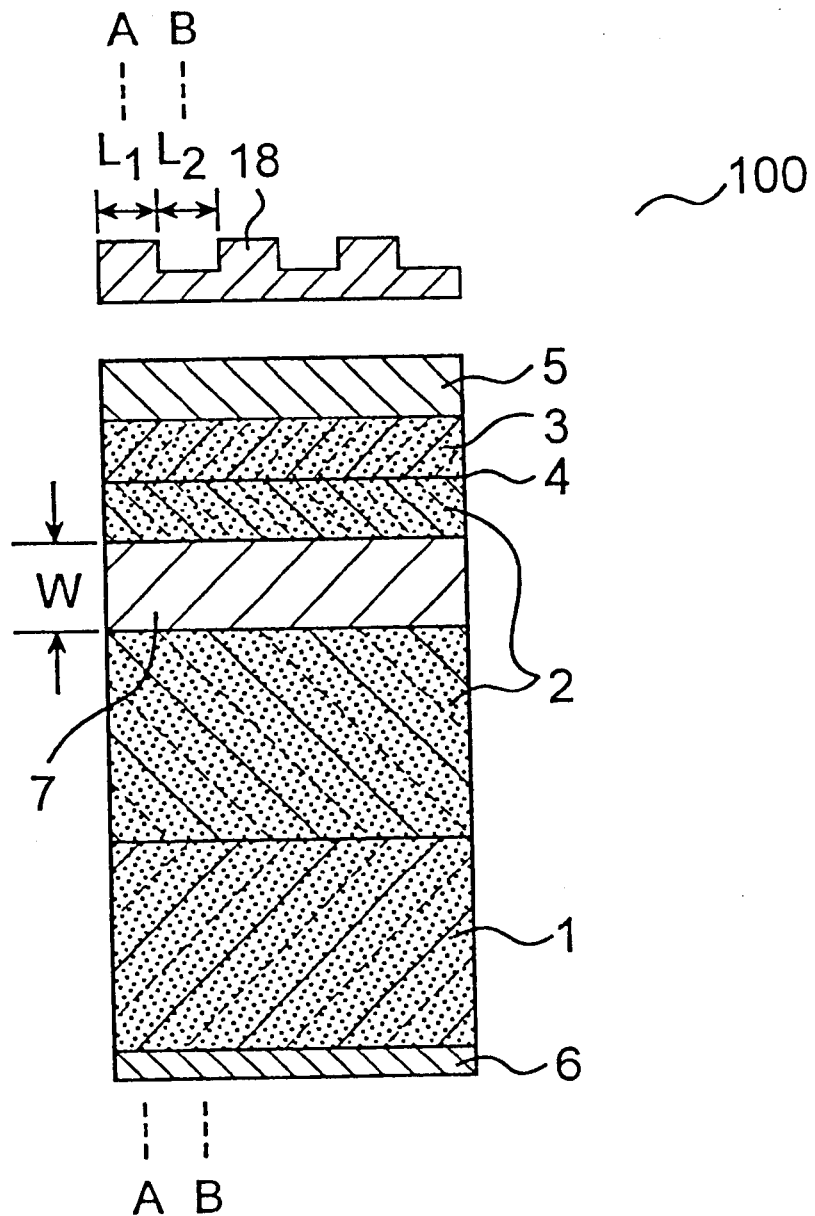
FIG. 1 is a cross sectional view of a pn junction diode device according to the first embodiment of the present invention.
Figure 9:
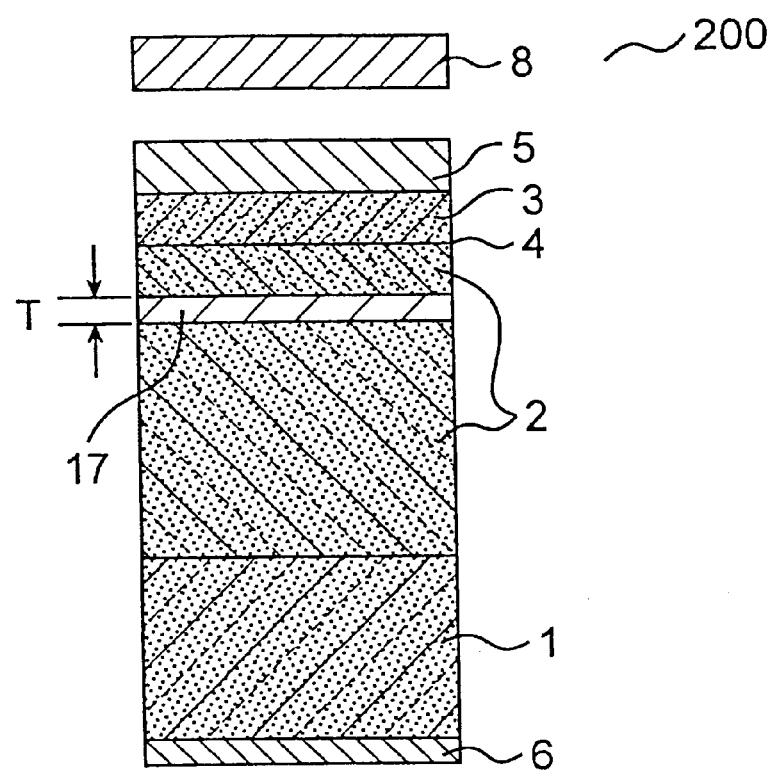
FIG. 9 is a cross sectional view of a conventional pn junction diode device relating to the present invention.

Referring to FIGS. 1 to 4, the first embodiment of a pn junction diode device according to the present invention will be described hereinafter. FIG. 1 is a cross sectional view of the pn junction diode device denoted by the reference numeral 100. In FIG. 1, similar elements to those in FIG. 9 are denoted by the same or similar reference numerals.

As illustrated in FIG. 1, the pn junction diode device 100 has a stacked structure including, in general, an n+ cathode layer 1, an n– cathode layer 2, and a p– anode layer 3. A pn junction interface 4 is formed at the interface between the n– cathode layer 2 and the p– anode layer 3. Each of the aforementioned layers is made of material including silicon.

Deposited on the top surface of the p– anode layer 3 is an anode electrode 5, while formed on the bottom surface of the n+cathode layer 1 is a cathode electrode 6. Each of the electrodes is made of material such as aluminum.

The pn junction diode device has a lattice-defect region 7 in the n– cathode layer 2 formed beneath and adjacent to the pn junction interface 4. The distribution of the lattice-defect region 7 according to the first embodiment 1 has a lower peak and a wider half-value width W than that of the conventional lattice-defect region 17, i.e., W>T. For example, the half-value width W of the lattice-defect region 7 according to the present embodiment may be in a range of about 15 to 20 microns, that is about 1.5 to 2.0 times wider than that of the conventional one.

In the pn junction diode device 100, the lattice-defect region 7 formed beneath and adjacent to the pn junction interface 4 serves a function as so-called a "life-time killer". Thus, the lattice-defect region captures and quenches the minority carriers, i.e., holes injected from the p– anode layer 3 into the n– cathode layer 2, therefore, the pn junction diode device can be protected from a reverse surge potential and a high rate switching can be realized.

Since the pn junction diode devices 100 includes the lattice-defect region 7 having the lower peak and the wider half-value width W than that T of the conventional device 200, the deviation of the lattice-defect concentration between the pn junction diode devices 100 can be reduced across the wafer. To this end, the deviation of the forward voltages between the devices on the wafer can substantially be reduced.

Next, the manufacturing process of the pn diode device 100 according to the first embodiment 1 will be described hereinafter. The manufacturing process includes, in general, Steps 1 to 5 as described below.

Step 1:

A silicon wafer including the n+ cathode layer 1 and the n– cathode layer 2 is prepared. The silicon wafer may have a diameter of 5 inches.

Step 2:

The p– anode layer 3 is formed on the n– cathode layer 2 by implanting p-type ions evenly across the n– cathode layer 2. The interface between the n– cathode layer 2 and the p– anode layer 3 becomes the pn junction interface 4.

Step 3:

The anode and cathode electrodes 5, 6 are formed, for example, of aluminum by evaporation on the p– anode layer 3 and the n+ cathode layer 1, respectively.

Step 4:

Low atomic number ions such as proton and helium ion are implanted by use of an ion accelerator such as a cyclotron so as to reach up to the n– cathode layer 2. Also, the ions are implanted through an absorber 18 made of material such as aluminum and silicon. After implanting ions, the n-cathode layer 2 is annealed so that most of the implanted ions are evacuated from the n– cathode layer 2, leaving the lattice-defect region 7 in the n– cathode layer 2.

Figure 2A:
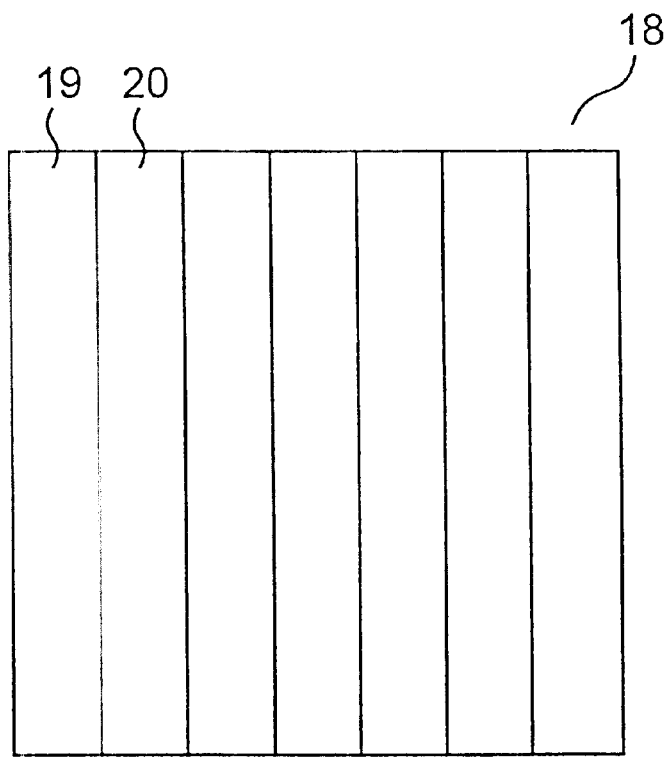
FIGS. 2A and 2B are a top and cross sectional views of an absorber used for manufacturing the pn junction diode device according to the first embodiment.
Figure 2B:
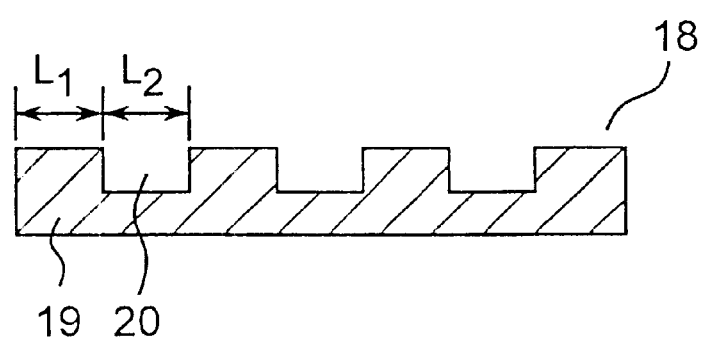

FIGS. 2A and 2B are enlarged top and cross sectional views of the absorber 18, respectively. The absorber 18 has a striped configuration having a plurality of thick and thin areas 19, 20 formed alternately, extending substantially in parallel to each other. As clearly shown in FIG. 2A, the thick areas 19 are thicker in a vertical (depth) direction than the thin areas 20. The absorber 18 with the striped configuration can be formed by etching a flat substrate of aluminum or silicon so as to obtain a plurality of grooves. Alternatively, the absorber 18 can be made by attaching a striped substrate having a plurality of bars onto a flat substrate.

As illustrated in FIG. 2B, the absorber 18 includes a plurality of the thick and thin areas 19, 20 having widths of L1, L2, respectively. Meanwhile, Rp is defined as an average projection range (depth) in the distribution of the ions implanted through the thin areas 20 of the absorber 18. Then, the width L1, L2 of the thick and thin areas 19, 20 are designed so that the following formula (1) is satisfied:

$$Rp \geq L1-L2 \quad (1)$$

L1, L2, and Rp can approximately be, for example, 20 microns, 10 microns, and 20 microns, respectively.

Figure 3A:
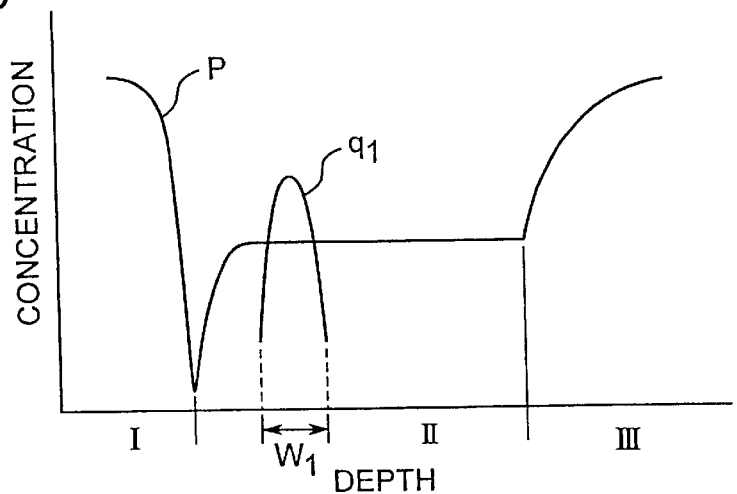
FIGS. 3A to 3C are graphs showing distributions of impurity concentrations in each layer and a lattice-defect concentration in a lattice-defect region of the pn junction diode device.
Figure 3B:
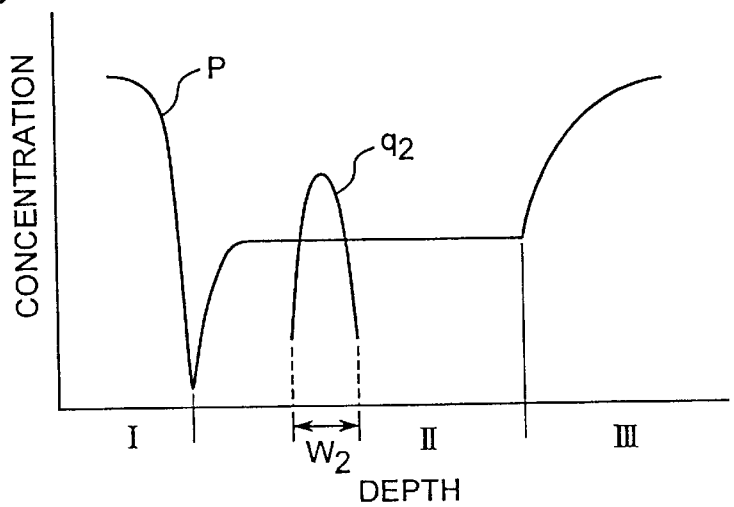
Figure 3C:
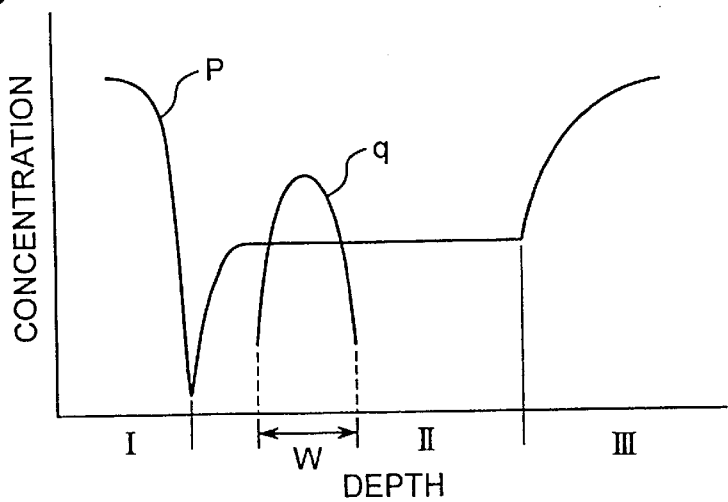

FIGS. 3A, 3B, and 3C are graphs illustrating carrier concentrations and a lattice-defect concentration depending upon the vertical distance (depth) from the top surface of the pn junction diode device. Thus, the anode and cathode electrodes 5, 6 are located to the left and right sides in FIG. 3, respectively. Also, the denotations of "p", "n", and "q" in FIG. 3 indicate distributions of the p-type and n-type impurity concentrations, and the lattice-defect concentration, respectively. The Roman numerals I, II, and III denote regions for the p− anode layer 3, the n− cathode layer 2, and the n+cathode layer 1, respectively.

FIG. 3A is a graph showing each concentration in a cross section taken by A—A line of FIG. 1. In FIG. 3A, the denotation of "q1" indicates the distribution of the lattice-defect concentration having a half-value width W1. Also, FIG. 3B is a graph showing each concentration in a cross section taken by B—B line of FIG. 1. In FIG. 3B, the denotation of "q2" indicates the distribution of the lattice-defect concentration having a half-value width W2.

Figure 10:
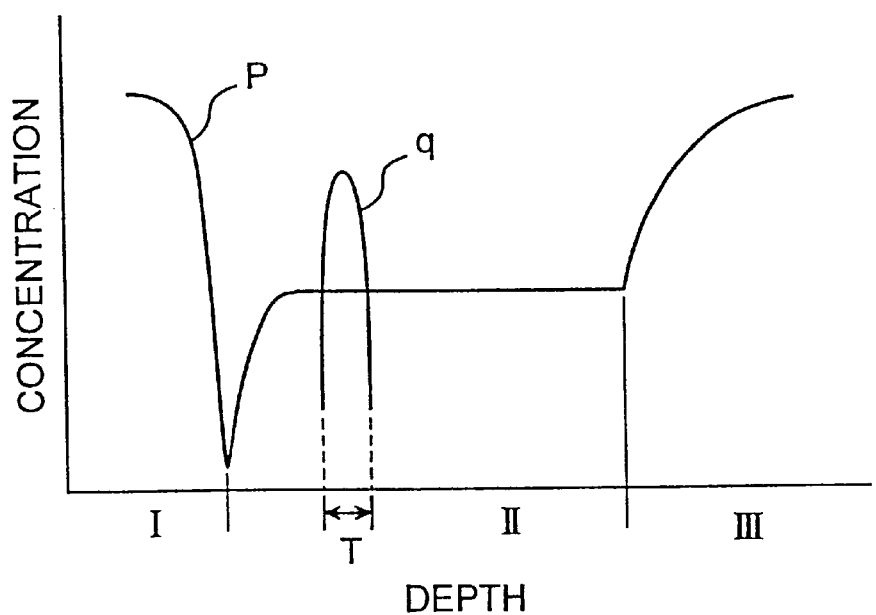
FIG. 10 is a graph showing distributions of impurity concentrations in each layer and a lattice-defect concentration in the lattice-defect region of the conventional pn junction diode device.

As clearly shown in FIGS. 3A and 3B, the peak of the distribution q1 is positioned on the left side of the peak of the distribution q2 (i.e., positioned closer to the anode electrode 5). Also, both of the peak heights of the distributions q1, q2 in FIGS. 3A, 3B are lower than the peak concentration of the distribution q shown in FIG. 10.

In practical, ions implanted into the n− cathode layer 2 are scattered and diffused also in a lateral direction, and the distribution q1 and q2 are overlapped side by side and merged into the actual distribution q of the lattice-defect concentration of the present invention as illustrated in FIG. 3C. Eventually, the lattice-defect region 7 has a uniform distribution q of the lattice-defect concentration across the wafer, thereby realizing a wider half-value width W and the lower peak concentration, remaining the total number of the defective lattices unchanged in the lattice-defect region 7. For example, the half-value widths W1, W2, and W indicated in FIGS. 3A, 3B, and 3C may approximately be 10 microns, 10 microns, and 15 to 20 microns, respectively.

Step 5:

The wafer is diced into a plurality of the pn junction diode devices 100.

As described above, according to the manufacturing process of the present invention, the lattice-defect region 7 with the wider half-value width W can be realized by only one implantation step.

Figure 4A:
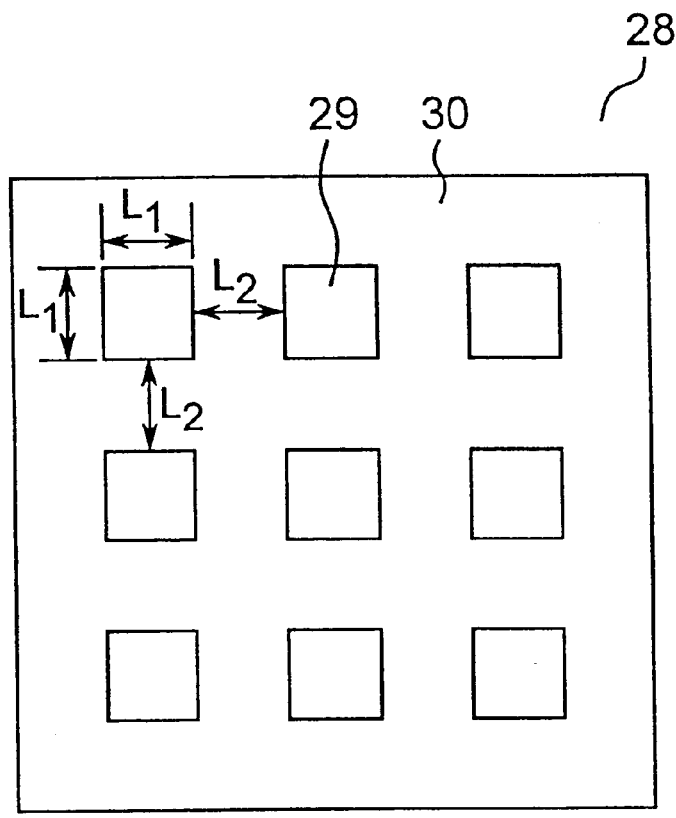
FIGS. 4A and 4B are a top and cross sectional views of an alternative absorber used for manufacturing the pn junction diode device according to the first embodiment.
Figure 4B:
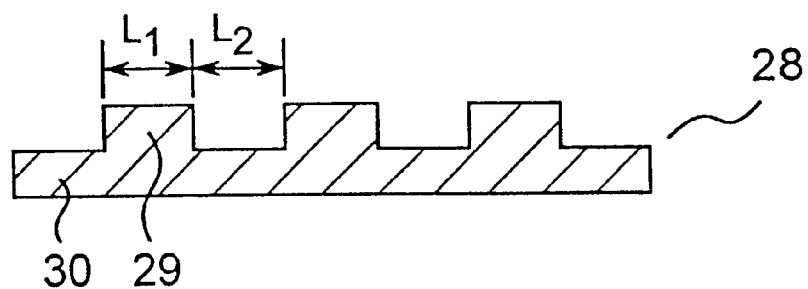

FIGS. 4A and 4B are an enlarged top and cross sectional views of an another absorber 28 used for the manufacturing process of the present embodiment, respectively. As shown in FIGS. 4A and 4B, the absorber 28 has a plurality of square thick areas 29 (protruded areas) having one side of L1 and a thin area 30 except the thick areas. Each thick area 29 is spaced by a gap of L2 away from each other. Thus, the absorber 28 has a matrix-shaped configuration.

Meantime, Rp is also defined as the average projection range in the distribution of the ions implanted through the thin areas 30 of the absorber 28. Then, the width L1, L2 of the thick and thin areas 29, 30 are designed so that the aforementioned formula is satisfied. For example, L1, L2, and Rp can approximately be 20 microns, 10 microns, and 20 microns, respectively.

Where the absorber 28 is used for manufacturing the lattice-defect region 7, similar distributions q1, q2 of the lattice-defect concentrations can be obtained as well as those shown in FIGS. 3A and 3B where the absorber 18 is used. Again eventually, the similar lattice-defect region 7 having a uniform distribution q of the lattice-defect concentration having a wider half-value width W and the lower peak concentration can be achieved.

The absorber 28 with the matrix-shaped configuration can be formed in a similar way to that of the absorber 18, by etching a flat substrate of aluminum or silicon so as to obtain a plurality of grids. Alternatively, the absorber 28 can be made by attaching a plurality of substantially square microsubstrates in a matrix onto a flat substrate.

Embodiment 2.

Figure 5:
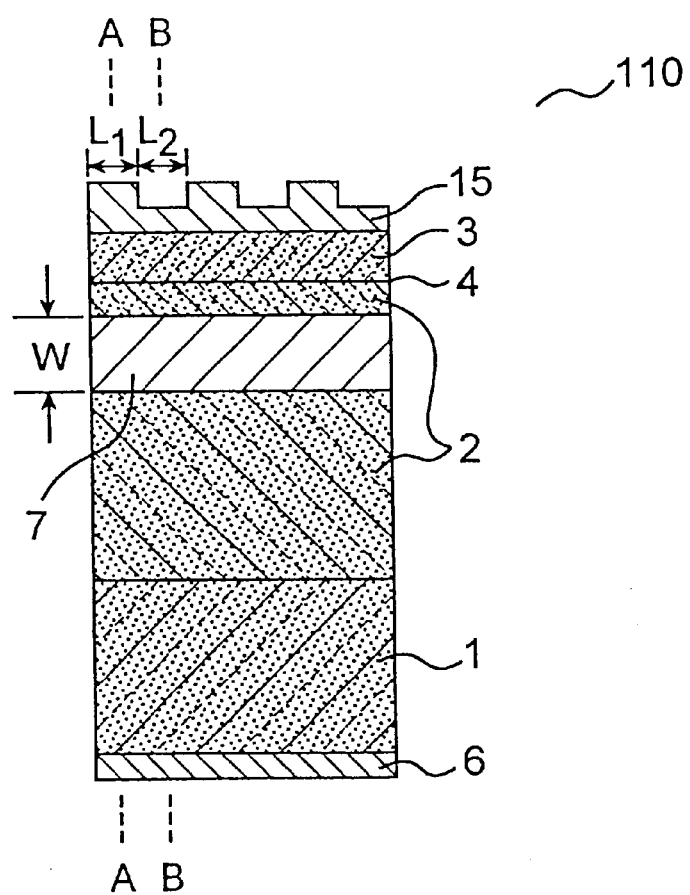
FIG. 5 is a cross sectional view of a pn junction diode device according to the second embodiment of the present invention.

FIG. 5 is a cross sectional view of the pn junction diode device according to the second embodiment denoted by the reference numeral 110. Any elements in FIG. 5 similar to those in FIG. 9 are denoted by the same or similar reference numerals.

In the pn junction diode device 110 shown in FIG. 5, the anode electrode 15 has a striped configuration including a plurality of thick areas and thin areas formed alternately, extending substantially in parallel to each other. Other elements of the device are the same as those of the pn junction diode device 100 as described above.

The average projection range Rp is also defined as the average range in the distribution of the ions implanted through the thin areas of the anode electrode 15. Then, the width L1, L2 of the thick and thin areas are selected so that the aforementioned formula (1) is met.

Next, the manufacturing process of the pn junction diode device 110 will be described hereinafter. In the manufacturing process, steps similar to Steps 1 and 2 according to the first embodiments are processed. Then, in Step 3, the striped anode electrode 15 having a plurality of thick and thin areas are formed.

In Step 4, ions such as protons are implanted through the anode electrode 15 up to the n cathode layer 2, which is annealed to evacuate the ions therefrom, thereby forming the lattice-defect region 7. The defective lattices formed by ions through the thick areas of the anode electrode 15 distribute as shown in FIG. 3A, corresponding to the distribution in the cross section taken by the A—A line in FIG. 5. Also, the defective lattices formed by ions through the thin areas of the anode electrode 15 distribute as shown in FIG. 3B, corresponding to the distribution in the cross section taken by the B—B line in FIG. 5.

Lastly, in Step 5, the wafer is diced into a plurality of the pn junction diode devices 110.

It should be noted that the anode electrode 15 can be formed also in a matrix-shaped configuration including a plurality of the square thick areas having one side of L1, which are spaced by a gap of L2 away from each other in the thin area.

To this end, the pn junction diode device 110 is protected by the surge potential and is capable of switching at a high rate. Also, the deviation of the forward voltages $V_F$ between the pn junction diode devices 110 can be reduced.

According to the manufacturing process of the present embodiment, only one implantation step can form the lattice-defect region 7 with the distribution of the defective lattice concentration, which has the lower peak concentration and the wider half-value width than the lattice-defect region formed by ions implanted with substantially the same energy (average projection range Rp). Therefore, the pn junction diode device can be manufactured in a simple and economical manner.

Embodiment 3.

Figure 6:
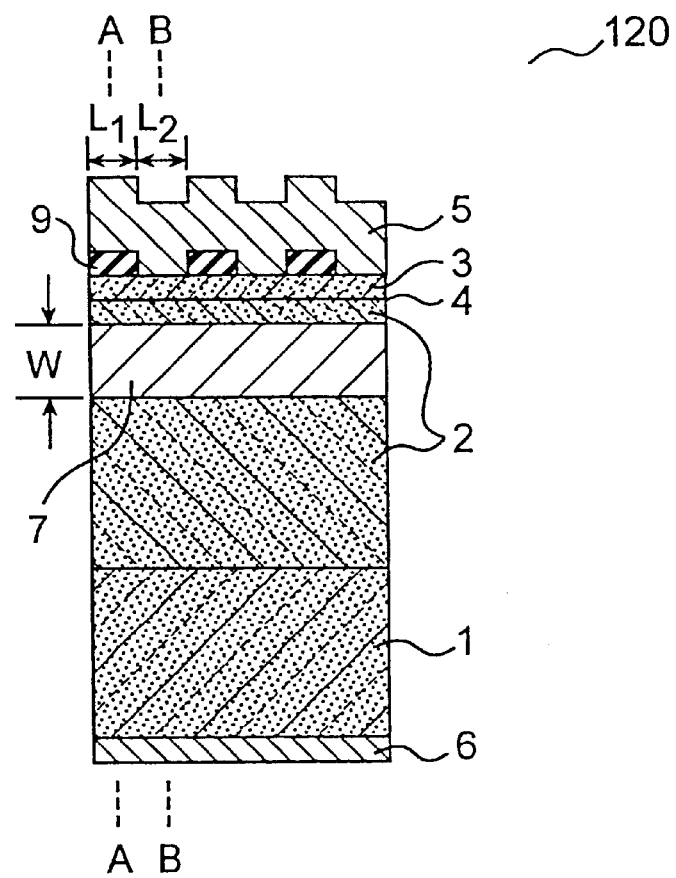
FIG. 6 is a cross sectional view of a pn junction diode device according to the third embodiment of the present invention.

FIG. 6 is a cross sectional view of the pn junction diode device according to the third embodiment denoted by the reference numeral 120. Any elements in FIG. 6 similar to those in FIG. 9 are denoted by the same or similar reference numerals.

In the pn junction diode device 120 shown in FIG. 6, an insulating layer 9 includes a plurality of insulating islands formed alternately, extending substantially in parallel to each other are formed on the p– anode layer 3. The insulating layer 9 is made of material such as silicon dioxide and silicon nitride. Each of the striped insulating islands on the anode layer 3 has a width of L1 and is spaced by a gap of L2 away from one another. The width L1 and the gap L2 are designed such that the average projection range Rp of ions passing through the gap satisfies the aforementioned formula (1). In particular, L1, L2, and Rp are approximately 20 microns, 10 microns, and 20 microns, respectively. The thickness of the striped insulating layer 9 may be about 10 microns.

The anode electrode 5 also has a configuration as shown in FIG. 6 since it is deposited on the striped insulating layer 9. Other structures are the same as those of the pn junction diode device 100 according to the first embodiment.

Next, the manufacturing process of the pn junction diode device 120 will be described hereinafter In the manufacturing process, steps similar to Steps 1 and 2 according to the first embodiments are processed.

Then, the striped insulating layer 9 having a plurality of insulating islands is formed on the p– anode layer 3, for example, by depositing an uniform layer of silicon dioxide by CVD and then by etching the uniform layer in a striped configuration. Also, in Step 3, the anode electrode 5 is formed to cover the insulating layer 9 so that it also has a striped configuration.

Next, in Step 4, protons are injected into the n– cathode layer 2 through the insulating layer 9 (i.e., the insulating islands and the gaps therebetween) so that the lattice-defect region 7 is formed in the n– cathode layer 2. The defective lattices formed by ions through the insulating islands of the insulating layer 9 distribute as shown in FIG. 3A, corresponding to the distribution in the cross section taken by the A—A line in FIG. 6. Also, the defective lattices formed by ions through the gaps between the insulating islands distribute as shown in FIG. 3B, corresponding to the distribution in the cross section taken by the B—B line in FIG. 6. Similar to the first embodiment, the resultant lattice-defect region 7 has a distribution overlapped by those shown in FIGS. 3A and 3B, which is illustrated in FIG. 3C, and has the wider half-value width W and the thickness substantially uniform across the wafer.

Lastly, in Step 5, the wafer is diced into a plurality of the pn junction diode devices 120.

Similar to the absorber 28 illustrated in FIG. 4, it should be noted that the insulating layer 9 can be formed also in a matrix-shaped configuration including a plurality of the square insulating islands having one side of L1, which are spaced by the gap L2 away from each other.

To this end, the pn junction diode device 120 is protected by the surge potential and is capable of switching at a high rate. Also, the deviation of the forward voltages $V_F$ between the pn junction diode devices 120 can be reduced.

According to the manufacturing process of the present embodiment, only one implantation shot can form the lattice-defect region 7 with the distribution of the defective lattice concentration, which has the lower peak concentration and the wider half-value width than the lattice-defect region formed by ions implanted with substantially the same implantation energy (average projection range Rp). Therefore, the pn junction diode device can be manufactured in a simple and economical manner.

Embodiment 4.

Figure 7:
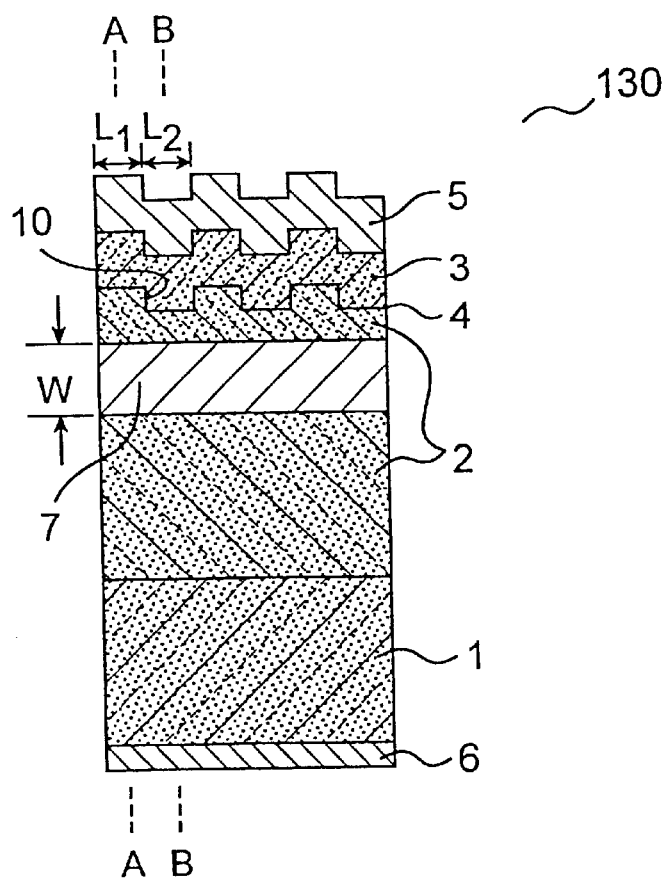
FIG. 7 is a cross sectional view of a pn junction diode device according to the fourth embodiment of the present invention.

FIG. 7 is a cross sectional view of the pn junction diode device according to the fourth embodiment denoted by the reference numeral 130. Any elements in FIG. 7 similar to those in FIG. 9 are denoted by the same or similar reference numerals.

In the pn junction diode device 130 shown in FIG. 7, a plurality of striped grooves 10 extending substantially in parallel to each other are formed on the n– cathode layer 2 (at the pn junction interface 4). The striped grooves 10 are formed by etching the top surface of the n– cathode layer 2. In other words, the n– cathode layer 2 includes a plurality of thin areas corresponding to the grooves 10 and thick areas corresponding to the area between the grooves 10. The adjacent grooves 10 have a space of L1 (corresponding to the width of the thick area), and each of the grooves 10 (corresponding to the thin areas) has a width of L2. Then, similar to the above embodiments, L1, L2 and Rp have a relationship expressed in the aforementioned formula (1). In particular, L1, L2, and Rp are approximately 20 microns, 10 microns, and 20 microns, respectively. The thickness of the striped grooves 10 may be about 10 microns.

The anode layer 3 and the anode electrode 5 also have cross sections similar to that of the n– cathode layer 2 in line with the grooves thereof as shown in FIG. 7, since they are deposited on the striped cathode layer 2. Other structures are the same as those of the pn junction diode device 100 according to the first embodiment.

Next, the manufacturing process of the pn junction diode device 130 will be described hereinafter. In the manufacturing process, the step similar to Step 1 according to the first embodiments is processed to prepare the silicon wafer including an n+ cathode layer 1 and n– cathode layer 2.

Then, the top surface of the n– cathode layer 2 are etched by an commonly used lithography and etching techniques to form a plurality of grooves 10 extending substantially in parallel to each other.

Next, the steps similar to Steps 2 and 3 according to the first embodiments is processed to form the p– anode layer 3 and the anode and cathode electrodes 5, 6.

Figure 8A:
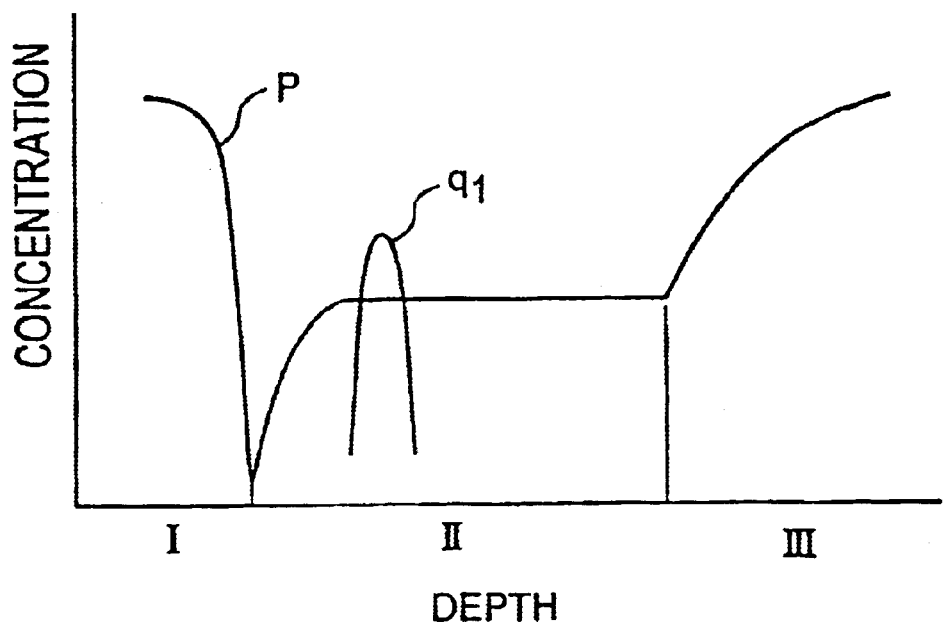
FIGS. 8A and 8B are graphs showing distributions of impurity concentrations in each layer and a lattice-defect concentration in the lattice-defect region of the pn junction diode device.
Figure 8B:
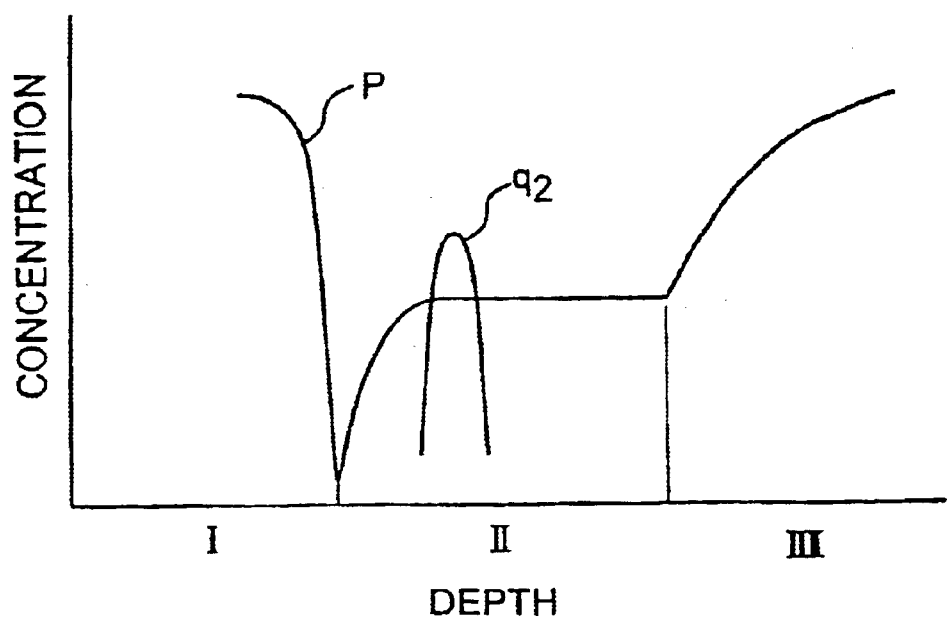

In Step 4, protons are injected into the n– cathode layer 2 through the anode electrode 5 so that the lattice-defect region 7 is formed in the n– cathode layer 2. FIGS. 8A and 8B are graphs illustrating the distributions of the carrier concentrations and the lattice-defect concentration. Any elements in FIGS. 8A and 8B similar to those in FIG. 3 are denoted by the same or similar reference numerals.

Next, in Step 4, protons are injected into the striped n– cathode layer 2 so that the lattice-defect region is formed in the n– cathode layer 2. The defective lattices formed by ions not through the grooves 10 (i.e., ions through the areas except the grooves 10) distribute as shown in FIG. 8A, corresponding to the distribution in the cross section taken by the A—A line in FIG. 7. Also, the defective lattices formed by ions through the grooves 10 distribute as shown in FIG. 8B, corresponding to the distribution in the cross section taken by the B—B line in FIG. 7. Similar to the first embodiment, the resultant lattice-defect region 7 has a distribution overlapped by those shown in FIGS. 8A and 8B, and has the wider half-value width W and the thickness substantially uniform across the wafer.

Lastly, in Step 5, the wafer is diced into a plurality of the pn junction diode devices 130.

It should be noted that the top surface of the n− cathode layer 2 can be formed also in a matrix-shaped configuration including a plurality of the square depressions having one side of L2, which are spaced by the gap of L1 away from each other.

To this end, the pn junction diode device 130 is protected by the surge potential and is capable of switching at a high rate. Also, the deviation of the forward voltages $V_F$ between the pn junction diode devices 130 can be reduced.

According to the manufacturing process of the present embodiment, only one implantation shot can form the lattice-defect region 7 with the distribution of the defective lattice concentration, which has the lower peak concentration and the wider half-value width than the lattice-defect region formed by ions implanted with substantially the same implantation energy (average projection range Rp). Therefore, the pn junction diode device can be manufactured in a simple and economical manner.

What is claimed is:

1. A process for manufacturing a pn junction diode, comprising the steps of:

providing a semiconductor wafer having an n-type cathode layer formed thereon;

forming a p-type anode layer on the n-type cathode layer so that a pn junction interface is formed between the n-type cathode layer and the p-type anode layer;

forming a cathode and anode electrodes on the semiconductor wafer and the p-type anode layer, respectively;

simultaneously implanting first and second ions having average projection ranges Rp different from each other up to the cathode layer so that one or more first and second implanted regions are formed alternately and overlapped side by side, and thereby forming a lattice-defect region having a substantially uniform thickness.

2. The process according to claim 1, further comprising the step of:

providing an absorber including one or more thick and thin areas having widths of L1 and L2, respectively, the thick and thin areas being formed alternately;

wherein the average projection range Rp of ions passing through the thin area satisfies a following formula, $Rp \geq L1-L2$; and wherein the step of simultaneously implanting includes implanting ions through the absorber.

3. The process according to claim 1, wherein the anode electrode includes one or more thick and thin areas formed alternately having widths of L1 and L2, respectively;

wherein the average projection range Rp of ions passing through the thin area satisfies a following formula, $Rp \geq L1-L2$; and wherein the step of simultaneously implanting includes implanting ions through the anode electrode.

4. The process according to claim 2, wherein the absorber has a striped configuration having the thick and thin areas extending substantially in parallel to each other.

5. The process according to claim 2, wherein the thick area is formed of a substantial square having one side of L1 so that the absorber has a matrix-shaped configuration.

6. The process according to claim 3, wherein the anode electrode has a striped configuration having the thick and thin areas extending substantially in parallel to each other.

7. The process according to claim 3, wherein the thick area is formed of a substantial square having one side of L1 so that the anode electrode has a matrix-shaped configuration.

8. The process according to claim 1, further comprising the step of:

forming an insulating layer including a plurality of insulating islands on the anode layer having a width of L1, each of the insulating islands being spaced by a gap of L2 away from one another;

wherein the average projection range Rp of ions passing through the gap satisfies a following formula, $Rp \geq L1-L2$; and wherein the step of simultaneously implanting includes implanting ions through the insulating islands and the gaps therebetween.

9. The process according to claim 8, wherein each of the insulating islands has a striped configuration extending substantially in parallel to one another.

10. The process according to claim 8, wherein each of the insulating islands is formed of a substantial square having one side of L1 so that the insulating layer has a matrix-shaped configuration.

11. The process according to claim 1, wherein the cathode layer is formed so as to include one or more thick and thin areas formed alternately having widths of L1 and L2, respectively;

wherein the average projection range Rp of ions passing through the thin area satisfies a following formula, $Rp \geq L1-L2$; and wherein the step of simultaneously implanting includes implanting ions through the anode layer.

12. The process according to claim 11, wherein the cathode layer has a striped configuration having the thick and thin areas extending substantially in parallel to each other.

13. The process according to claim 11, wherein each of the thin areas is formed of a substantial square having one side of L2 so that the insulating layer has a matrix-shaped configuration.

14. The process according to claim 1, wherein ions implanted up to the cathode layer are selected from a group consisting of proton and helium ion.

15. A pn junction diode comprising:

a semiconductor wafer including an n-type cathode layer;

a p-type anode layer formed on the n-type cathode layer so that a pn junction interface is formed between the n-type cathode layer and the p-type anode layer;

a cathode and anode electrodes formed on the semiconductor wafer and the p-type anode layer, respectively; and a lattice-defect region in the n-type cathode layer having a substantially uniform thickness;

wherein the lattice-defect region has a distribution of lattice-defect concentration with a half-value width greater than that of the lattice-defect region formed by implanting ions having average projection ranges Rp substantially the same as each other.

16. The pn junction diode according to claim 15, wherein the lattice-defect region includes one or more first and second implanted regions formed alternately by implanting ions having average projection ranges Rp different from each other and overlapped side by side so that the lattice-defect region has defective lattices distributed across the region substantially in an uniform manner.

17. The pn junction diode according to claim 15, wherein the anode electrode includes one or more thick and thin areas formed alternately having widths of L1 and L2, respectively; and wherein the average projection range Rp of ions passing through the thin area satisfies a following formula, $Rp \geq L1-L2.$ 18. The pn junction diode according to claim 15, further comprising:

an insulating layer including a plurality of insulating islands on the anode layer having a width of L1, each of the insulating islands being spaced by a gap of L2 away from one another;

wherein the average projection range Rp of ions passing through the gap satisfies a following formula, $Rp \geq L1-L2.$ 19. The pn junction diode according to claim 15, wherein the cathode layer is formed so as to include one or more thick and thin areas formed alternately having widths of L1 and L2, respectively;

wherein the average projection range Rp of ions passing through the thin area satisfies a following formula, $Rp \geq L1-L2.$

* * * * *